United States Patent [19]

Romano-Moran et al.

[11] 4,382,827
[45] May 10, 1983

[54] SILICON NITRIDE S/D ION IMPLANT MASK IN CMOS DEVICE FABRICATION

[75] Inventors: Roberto Romano-Moran, Centerville; Ronald W. Brower, Kettering, both of Ohio

[73] Assignee: NCR Corporation, Dayton, Ohio

[21] Appl. No.: 258,189

[22] Filed: Apr. 27, 1981

[51] Int. Cl.³ .................. H01L 21/265; H01L 7/54
[52] U.S. Cl. .................... 148/1.5; 29/571; 29/576 B; 148/187; 357/42; 357/97
[58] Field of Search ............. 148/1.5, 187; 29/571, 29/576 B; 357/42, 91

[56] References Cited

U.S. PATENT DOCUMENTS

| | | | |
|---|---|---|---|
| 4,043,025 | 8/1977 | Spadea | 29/571 |
| 4,046,606 | 9/1977 | Lambert | 148/187 |
| 4,110,899 | 9/1978 | Nagasawa et al. | 29/571 |
| 4,221,045 | 9/1980 | Godejahn, Jr. | 29/571 |
| 4,244,752 | 1/1981 | Henderson, Sr. et al. | 148/1.5 |
| 4,268,321 | 5/1981 | Meguro | 148/1.5 |
| 4,272,308 | 6/1981 | Varshney | 148/1.5 |
| 4,280,272 | 7/1981 | Egawa et al. | 29/571 |
| 4,306,916 | 12/1981 | Wollesen et al. | 148/1.5 |
| 4,314,857 | 2/1982 | Aitken | 148/1.5 |

FOREIGN PATENT DOCUMENTS 2930630 3/1980 Fed. Rep. of Germany .

Primary Examiner—Upendra Roy
Attorney, Agent, or Firm—J. T. Cavender; Philip A. Dalton; Casimer K. Salys

[57] ABSTRACT

A coplanar CMOS process for fabricating self-aligned gate FETs utilizing high energy, high dose rate ion implants to form the S/D regions. In the course of coplanar processing, the gate electrodes and S/D regions are defined. Selectively prescribed thicknesses of silicon dioxide are then formed over the top and sidewalls of the gate electrodes, as well as the exposed substrate in the S/D regions. Thereafter, a first, silicon nitride layer of controlled thickness is evenly deposited, and is followed by a dry etch step to expose the thin layer of silicon dioxide covering the p-channel FET S/D regions. The temperature stability of silicon nitride protects the n-channel FETs from the effects of the high energy levels and currents associated with the ion implant step used to form the S/D regions of the p-channel FETs. In contrast, the implant ions readily penetrate the thin oxides over the S/D regions of the p-channel FETs. Thereafter, a second, silicon nitride layer of controlled thickness is deposited. Again, it is followed by a dry etch step, but now to expose the silicon dioxide covering the n-channel FET S/D regions. The succeeding n-channel S/D implant similarly penetrates the silicon dioxide coverings, while the silicon nitride serves as a barrier for the remaining substrate surface. After S/D implanting is completed, a highly preferential etchant is used to remove the remaining silicon nitride, while the areas protected by the relatively thin layers of silicon dioxide are substantially unaffected.

5 Claims, 13 Drawing Figures

SILICON NITRIDE S/D ION IMPLANT MASK IN CMOS DEVICE FABRICATION

BRIEF SUMMARY OF THE INVENTION

The present invention is generally directed to a process for fabricating semiconductor devices having p-type and n-type doped regions in a common substrate. In a preferred form, it relates to a refined process for forming complementary metal oxide semiconductor (CMOS) type field effect transistors (FETs) by altering the generally-known coplanar process. In the manner practiced, the process lends itself to structures characterized by single dopant polycrystalline silicon electrodes and self-aligned gates. The ion implants of the source-drain (S/D) regions are performed at relatively high implant energy levels and beam currents. Consequently, shallow, but high impurity density, S/D junctions are formed in CMOS structures having self-aligned gates and doped polycrystalline silicon electrodes.

With more particularity, the process departs from the convention at a step in the process after the field oxides are formed and the doped polycrystalline silicon electrodes are deposited and photolithographically defined. During the plasma etch associated with the electrode definition, only the gate and interconnect electrode areas, each covered by silicon dioxide, are not etched away. The S/D regions of the substrate are exposed. Thereafter, a nominal thickness of silicon dioxide is grown on the sidewall of each polycrystalline silicon electrode, while a thinner layer of silicon dioxide is simultaneously formed on the exposed substrate in each of the S/D regions. The silicon dioxide formed over each S/D region is by selection sufficiently thin to be substantially permeable to impurity ions during the succeeding implant step, yet adequately thick to protect the underlying substrate from silicon nitride etchants used subsequently in the process.

The wafer is then covered by a deposition of silicon nitride, which is in succession photolithographically defined and dry plasma etched to expose the p-channel FET S/D regions. The regions, however, retain a thin covering of silicon dioxide. The silicon nitride layer covering the n-channel FETs serves as an ion implant mask, readily withstanding the high wafer temperatures encountered during the boron implant into the p-channel S/D regions. Since the silicon nitride is a protective barrier for the n-channel S/D regions, it must be sufficiently thick to be substantially impermeable to boron ions.

After the first ion implant is completed, another silicon nitride layer is deposited over the surface of the wafer. In this case, the succeeding steps photolithographically expose the S/D regions of the n-channel FETs for arsenic ion implanting. As was true for the previous silicon nitride layer, the depth of the new layer is by selection just sufficient to protect the complementary FETs during the S/D implant of the n-channel FETs.

At the conclusion of the n-channel implant, all remaining silicon nitride is removed using an etchant having a very high preferential etch ratio between silicon nitride and silicon dioxide. Thereby, the thin silicon dioxide layers covering the various exposed surfaces protect the underlying polycrystalline silicon electrodes and monocrystalline silicon S/D regions of the substrate.

DETAILED DESCRIPTION

Figure 1:
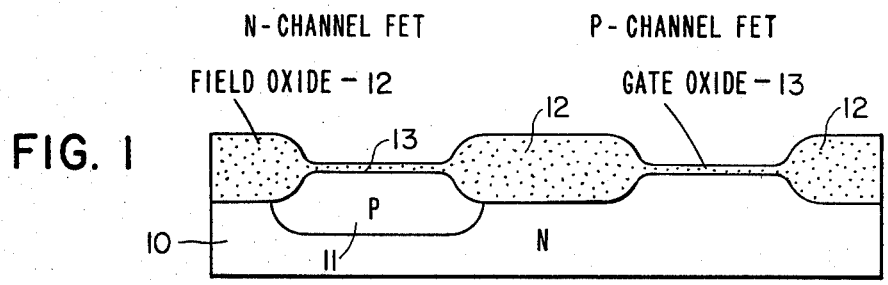
FIGS. 1-13 depict the sequential stages in the processing of a complementary pair of CMOS FETs, shown by way of cross-sectional schematics. In the figures, conventional abbreviations are used to designate the various materials. The abbreviated terminology conforms to the following: field oxide is field region silicon dioxide, gate oxide is gate area silicon dioxide, CVD oxide is CVD formed silicon dioxide, phosp. doped poly is phosphorus doped polycrystalline silicon, PR is photoresist, and nitride is silicon nitride.

By definition, CMOS integrated circuits (ICs) require both p-channel and n-channel FETs on the same semiconductor chip. To account for the opposite resistivity type in the two channels, islands or wells are formed in the semiconductor substrate and are doped to have a conductivity opposite that of the substrate. Contemporary preference is to utilize an n-type substrate, for the p-channel FETs, and diffused p-type wells for the n-channel FETs, though substrates and wells of the opposite dopant are being considered for the future. Undoubtedly, one recognizes that the present invention, though embodied in one form, is amenable to fabrication having either configuration.

In the pursuit of higher component densities in CMOS ICs, scaling techniques and processing steps have been conceived and refined to produce active circuit devices with exceptionally small dimensions. The coplanar process, often referred to as the LOCOS process, is particularly suited for fabricating ICs with high component density levels by utilizing self-aligned gate electrodes and field guard rings to suppress parasitic devices. The field guard rings are the regions of greater impurity density underlying the field oxide. As the vertical dimensions of such IC devices decrease further, the source and drain regions of the individual FETs must also shrink. This reduction of the S/D regions is generally accomplished by using refined ion implant techniques to dope the S/D regions with $p^+$ and $n^+$ impurities. With a judicious choice of impurity types and annealing conditions, relatively small and shallow, but heavily doped, S/D regions can be formed in the chip.

The demand for higher dopant concentrations at shallow depths are not limited to the S/D regions of the CMOS ICs, since the increase in density also dictates that the electrical interconnects be formed with diffusion lines in the substrate. Like the S/D regions, the diffusion lines must be shallow, yet low in resistivity.

Given the pervasive need for higher dopant concentrations with relatively shallow penetration depths, one is confronted by the inherent limitations of conventional processes. Generally, contemporary manufacturing processes prescribe ion implanting as the method for selectively doping substrate regions. If low or medium ion energy and implant dose rates are used, the concentration and depth requirements for shallow S/D regions cannot be satisfied. Furthermore, high doses, for instance, $10^{15}$–$10^{16}$ ion/centimeters squared implanted with energy levels of 20–200 KeV, still require high ion implant beam currents if the processes are to be completed within a reasonable period of fabrication time. Note, however, that combinations of high currents and energy levels inherently raise the wafers to temperatures significantly greater than normally experienced during fabrication. The implications of such elevated temperatures will be described hereinafter.

Generally, during the fabrication of the S/D regions of the p-channel FETs and p-type interconnects, the S/D regions and interconnects of the n-type areas are somehow protected from the p-type boron implant ions. Conversely, the n-type areas are implanted with phosphorus, arsenic or antimony ions while the p-type areas are protected. In the general practice of the prior art, photoresist materials served adequately as the ion barrier. However, photoresist masks are suited only for moderate temperature environments, represented by processes in which the ion implant dose rates and energy levels are low or medium in relative amplitude. Photoresist masks may remain viable at high implant rates, but only if extraordinary measures are taken to cool the wafer during the implant process. If such precautions are not incorporated into the process, and high dose rates and energy levels are implemented, the photoresist burns or flows, with a consequential deformation of the photolithographic pattern, non-uniform implant resistivity and likely contamination of the implant chamber. With conventional photoresist materials and implant apparatus, process integrity limits the wafer temperature to about 160° C. Consequently, one now recognizes the need for specialized cooling or process refinements if high ion implant dose rates and energy levels are to be utilized.

Superficially, the replacement of the photoresist with a material more suited for high temperature environments may seem to be an immediate answer. However, readily known substitutes for photoresist do not exhibit the ease of deposition, pattern definition and selective removal sought in volume fabrication of integrated circuits. Substitute mask materials are normally processed with dry etchants which are known to attack not only the mask material but also the IC wafer itself. For instance, if thick silicon dioxide is used as an ion implant mask, pattern etching or mask removal steps subject any protective silicon dioxide layers to the same etchants. Furthermore, in the case of silicon dioxide, the conventional dry etchants readily attack polycrystalline silicon gate electrodes and interconnects at rates significantly greater than the silicon dioxide. Though wet etching processes may not suffer to the same extent, the convenience and quality of dry etching processes have created a definite trend in that direction for conventional fabrication. Thus, without extreme care silicon dioxide is not a viable mask material. Other potential barrier materials suffer with similar detractions when implemented according to processes known in the art.

The present invention, as embodied in the description, discloses a material and method uniquely suited for solving the problem defined hereinbefore. In one form of practicing the invention, a silicon nitride layer serves as the implant barrier. When implemented in the manner to be described, S/D and interconnect regions are readily delineated using standard photolithographic techniques in combination with steps of dry plasma etching. The beneficial aspects of coplanar processing, with polycrystalline silicon and self-aligned gates, single impurity type polycrystalline silicon interconnects, minimal mask alignment constraints and few process masks, are retained, while gaining the ability to create shallow regions with high dopant concentrations.

To illustrate one embodiment of the present invention, consider the process sequence used to fabricate a CMOS IC, with the aid of the figures depicted in the drawings. No doubt one is aware that the various figures are not scale representations, but rather, in the form of schematics to illustrate the important aspects of each step in the fabrication process. FIG. 1 enters at a recognized step in the coplanar process, showing an n-type substrate, 10, a p-type well, 11, thick field oxides, 12, and thin gate oxides, 13. Channel stopper implants under the field oxides are normally introduced in a prior step. Since the substrate and well designations are well-known, their repeated delineation and dopant marking is dispensed with after FIG. 1.

Figure 2:
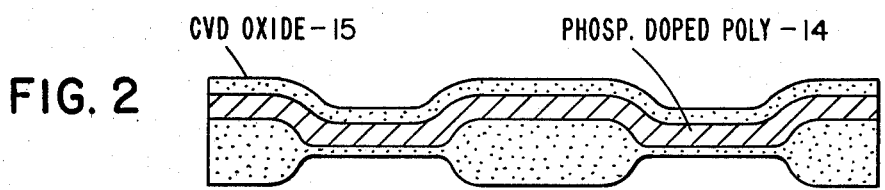
Figure 3:
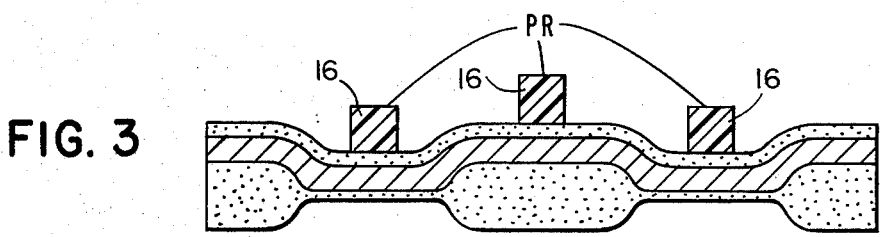

FIG. 2 illustrates the relative organization of the IC after a deposition of phosphorus (n-type impurity) doped polycrystalline silicon, 14, followed by a covering of chemical vapor deposition (CVD), or thermally grown, silicon dioxide, 15, in the manner of the known art. In a similarly-known manner of the art, a photoresist (PR) mask is deposited and photolithographically delineated in FIG. 3. The CVD silicon dioxide is then selectively removed with a wet etch, and followed in sequence by a dry plasma etch through the polycrystalline silicon layer, using the photoresist, 16, as a mask.

Figure 4:
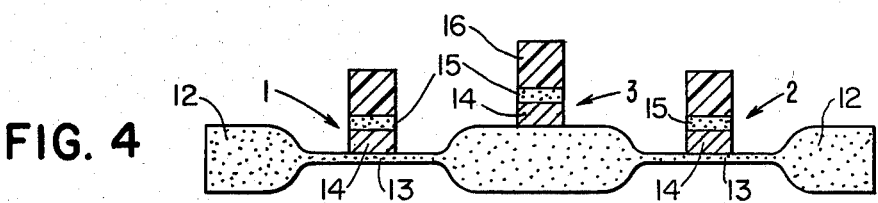

FIG. 4 depicts the general structure which results from the steps in the preceding figures, including an n-channel gate area, 1, a p-channel gate area, 2, and a doped polycrystalline silicon interconnect electrode area, 3. Given the structural organization depicted, and the intended utilization of the gate electrodes as the implant masks, the depth of the CVD silicon dioxide, 15, covering the polycrystalline silicon is preferably about 3,000 Angstroms. This depth coincides with a boron implant performed at an energy of approximately 30 KeV. Though thinner layers of silicon dioxide are feasible when the polycrystalline silicon is heavily doped with an impurity of phosphorus (n-type dipant), care must still be exercised to prevent significant boron accumulation in the polycrystalline lest it subsequently migrate through the gate oxide to contaminate the channel region in the substrate layer.

Figure 5:
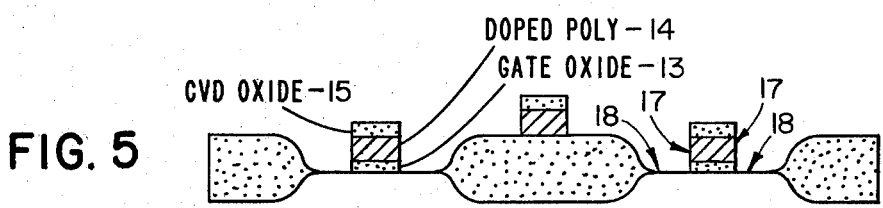
Figure 6:
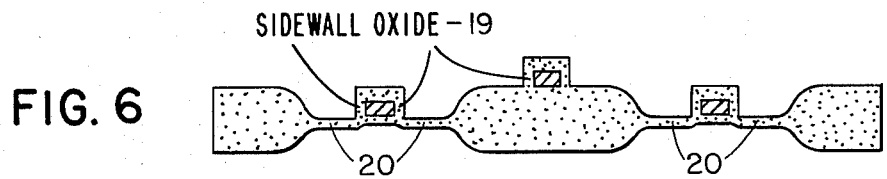

It is with FIG. 4 that the present process departs significantly from the general prior art and embarks upon procedural steps unique to the invention. In one form of practicing the invention, a brief wet etch step is first used to remove the exposed areas of the gate oxides, 13. The field oxides, 12, and CVD oxides, 15, over the polycrystalline silicon electrodes, at 1, 2 and 3, remain by virtue of their significantly greater thickness. Thereafter, the bare sidewalls, at 17, of the polycrystalline silicon electrodes and monocrystalline silicon S/D regions of the substrate, at 18, as shown in FIG. 5, are thermally oxidized to form a covering of silicon dioxide 19. Refer to FIG. 6. This step protects the exposed vertical walls of the polycrystalline silicon from process ambients, for example the potential sources of auto-doping, while providing a better match in terms of thermal coefficient of expansion with the succeeding layer of silicon nitride. The oxidation conditions and dopant levels in the polycrystalline silicon gate are selected so that the sidewall oxides, 19, are grown to a thickness in the range of 1,500–2,500 Angstroms, while the S/D region silicon dioxide levels, 20, reach approximately 500 Angstroms. The significant differences in growth rate are primarily due to the differences in dopant levels, but are, nevertheless, influenced to some degree by the polycrystalline character of the gate electrode in contrast to the monocrystalline character of the S/D region in the substrate. It should not be overlooked that the top surface of the electrode, covered by the CVD oxide, 15, also experiences a growth in oxide depth. The increase in depth is not nearly to the same extent as the sidewalls, reaching a level of about 3500 Angstroms for the conditions described above.

Given that silicon nitride is to be utilized in this embodiment as the implant barrier, attention must be redirected briefly to consider some constraints intrinsic to the materials and energy levels. Undoubtedly, any silicon nitride layer used as implant barrier must be thick enough to prevent penetration of the impurity ion utilized. In this context, if one plots the concentration of the implant species versus depth of penetration, the plot obtained is approximately Gaussian in its distribution. Use $R_p$ to represent the range, defined as the depth at which the concentration reaches its Gaussian peak. Reference to empirical and statistical data will show that both $R_p$ and the standard deviation ($\sigma$) for the Gaussian distribution are functions of the implant energy, the implant species, and the material into which the species are implanted. For silicon nitride as the implant recipient, Table 1 represents the approximate statistical penetration for boron and arsenic with respective energy levels of 30 KeV and 80 KeV.

TABLE 1

|  | 30 KeV Boron Implant | | 80 KeV Arsenic Implant | |
| --- | --- | --- | --- | --- |
|  | $Si_3N_4$ | $SiO_2$ | $Si_3N_4$ | $SiO_2$ |
| $R_p$ | 740 A | 950 A | 300 A | 390 A |
| $\sigma$ | 270 | 370 | 100 | 130 |
| $5\sigma$ | 1350 | 1710 | 490 | 630 |
| $R_p + 5\sigma$ | 2070 | 2260 | 790 | 1010 |

A conservative description of a process relying on the data in the Table would establish that the implant is sufficiently blocked if only an extreme tail of the Gaussian distribution, at least $5\sigma$ from the peak, penetrates the blocking layer. With this barrier depth, the implanted impurity concentration penetrating is approximately $10^{-5}$ lower than the peak concentration in the barrier. Referring to the Table for a depth of $R_p+5\sigma$, one extracts that a silicon nitride layer of 2,100 Angstroms is suitable during the 30 KeV boron implant, and 800 Angstroms during the 80 KeV arsenic implant. It should not be overlooked that these silicon nitride masking layers are exemplary for the impurity species and energy levels of the present embodiment. Accordingly, refinements will be necessary as materials, energy levels and process tolerances dictate.

Figure 7:
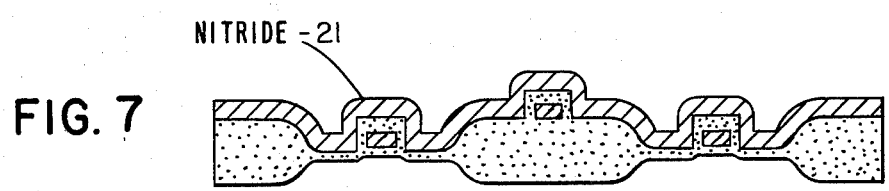
Figure 8:
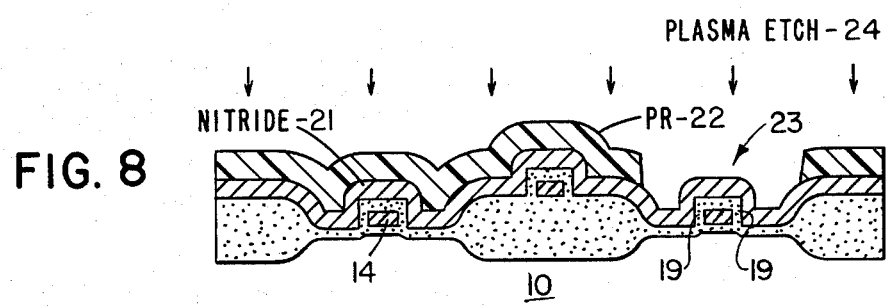

With an understanding of some of the underlying constraints at hand, attention is again drawn to the figures illustrating the process steps. The oxidized surface shown in FIG. 6 is now coated with a 2,000 Angstrom layer of silicon nitride 21 in FIG. 7. As embodied, a photoresist layer, 22, is applied over the deposited silicon nitride and delineated to expose the p-channel active area, 23. FIG. 8 shows the silicon nitride, 21, exposed through the photoresist, 22, undergoing a dry plasma etch, 24, to remove the region covering the p-channel device. Though the invention was practiced with a plasma containing $CF_4$ and oxygen in a barrel etcher, a planar etcher with gases having better selectivity is preferred. One reason for the sidewall oxide, 19, is now recognized. The $CF_4$ plasma used to etch the silicon nitride, 21, also attacks the polycrystalline silicon, 14, and the monocrystalline substrate, 10, both at a rate many times greater than the silicon nitride etch rate. In contrast, the etch rate of silicon dioxide is relatively low, allowing the silicon dioxide to serve as a protective buffer.

Figure 9:
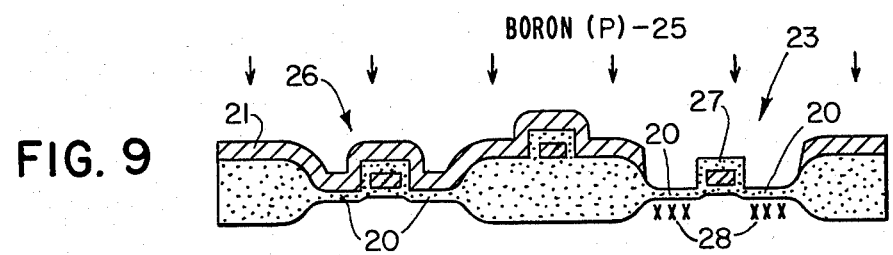

The illustration in FIG. 9 shows that the low temperature photoresist, 22, is removed before undertaking the boron ion implant, 25, to form the p+ doped S/D regions, 28, of the p-channel FET, 23. During the implant, the n-channel FET region, 26, is masked by the combination of the 2,000 Angstrom silicon nitride layer, 21, and approximately 500 Angstroms of silicon dioxide 20 grown over the S/D regions. The self-aligned channel area of the p-channel FET, 23, is protected from boron doping by the covering of 3500 Angstroms of silicon dioxide 27. In contrast, the S/D regions of the p-channel FET, 23, are readily doped through the 500 Angstroms of silicon dioxide 20 when the implant is performed with an energy of 30 KeV. Refer to Table 1.

Figure 10:
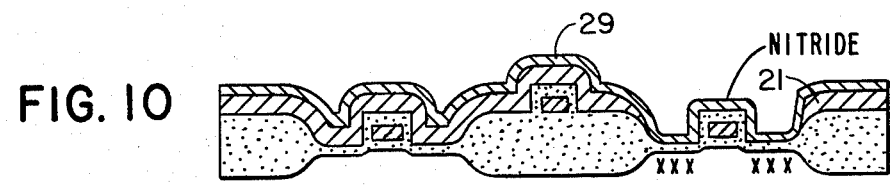
Figure 11:
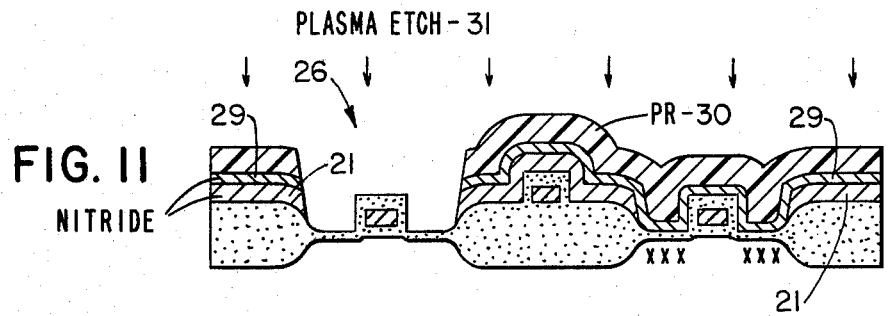
Figure 12:
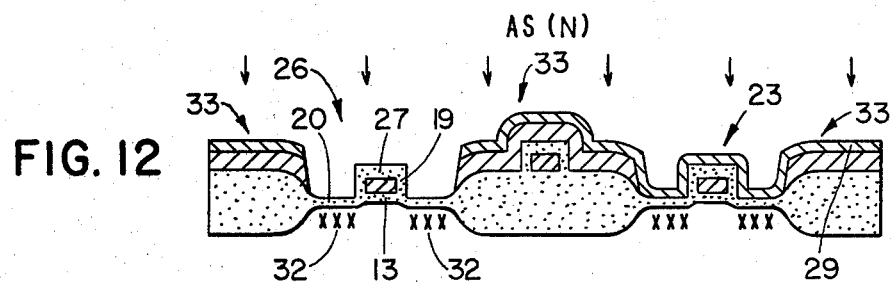

FIGS. 10 and 11 show the deposition of another silicon nitride layer, 29, to a depth of approximately 800 Angstroms, followed by a photolithographic definition in a photoresist layer, 30, and a dry plasma etch, 31. $CF_4$ again serves as the etchant material, removing the 2800 Angstrom cumulative thickness of silicon nitride, 21 and 29, over the S/D region of the n-channel FET, 26. Following the removal of the photoresist, 30, arsenic ions 32 (n-type dopant) are implanted, as schematically depicted in FIG. 12, by penetration through the approximately 500 Angstroms of oxide 20 over the S/D regions. Again, referring back to Table 1, it is evident that the 800 Angstroms of silicon nitride 29 prevents arsenic ion penetration into the p-channel FET, 23, when the arsenic implant energy is 80 KeV. Likewise, the 3500 Angstroms of silicon dioxide 27 protects and self-aligns the n-type channel.

It now becomes apparent why the silicon dioxide thickness over the S/D regions was limited to approximately 500 Angstroms or less. Were the gate oxide, 13, of approximately 600 Angstroms not removed prior to the growth of the sidewall oxide, 19, and the S/D oxide, 20, of 500 Angstroms, the combined thickness of the oxide covering the S/D region, approximately 1,100 Angstroms, would exceed the nominal penetration of the proposed arsenic implant. From the foregoing, it is clear that the various steps are closely related in accomplishing the final objective.

Figure 13:
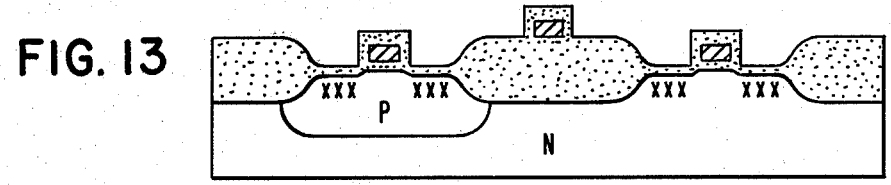

The final step in the process, removing the residual silicon nitride, 21 and 29, leads to the IC configuration depicted in FIG. 13. Note that it is necessary to remove a total of 2800 Angstroms of silicon nitride in the field oxide regions, 33, while the p-channel FET, 23, is covered by only 800 Angstroms and the n-channel FET, 26, lacks any silicon nitride covering. Care must be exercised to avoid etching into the S/D regions and laterally into the polycrystalline silicon electrode walls, while reliably removing the thickest silicon nitride layer. Residuals of silicon nitride have been linked to instabilities during the operation of IC FETs.

The present embodiment relies upon the preferential etch ratio of hot phosphoric acid ($H_3PO_4$). The 50:1 etch ratio, nitride to oxide, exhibited by hot phosphoric acid removes the approximately 2800 Angstroms of silicon nitride while only dissolving approximately 60 Angstroms of silicon dioxide on a continuously exposed surface, for instance the n-channel FET. Recalling that the thinnest silicon dioxide layer is the 500 Angstroms over the S/D region of the n-channel FET, it is apparent that the embodying process provides an adequate margin for fabrication. Furthermore, recent advances in dry etching suggest that new materials, exhibiting acceptable preferential etch ratios, may be available in the foreseeable future as substitutes for this wet acid etchant. A preferential etch ratio greater than 20:1 would be sufficient.

The CMOS fabrication steps following from the structure in FIG. 13 are fairly rudimentary for those skilled in the art. Consequently, they will be described by summary. Namely, a thick isolation oxide is deposited, contact holes are formed therethrough, aluminum interconnects are deposited and delineated, and the final passivation layer is deposited and delineated.

Test devices fabricated according to the embodied process have exhibited excellent performance characteristics. For example, inverter chains have demonstrated propagation delay times of 1.5 nanoseconds per gate with a 5 volt drain-to-source voltage and channel width to channel length ratios at the mask of 50/6 and 25/5 for n-channel and p-channel devices, respectively.

We claim:

1. An improved process for forming S/D regions during the fabrication of CMOS devices, in which the substrate is defined into p and n-channel FET regions, and p and n-channel FET gate electrodes are formed over a portion of the gate oxide covering said FET regions, wherein the improvement comprises the steps of:
   forming a layer of dielectric material to protect such gate electrodes from implantation materials;
   depositing a first layer of high temperature material to a thickness substantially impermeable to an implantation with a first impurity type material;
   removing said first layer of high temperature material in a first FET region of said substrate;
   subjecting said substrate to implantation using said first impurity type material;
   depositing a second layer of high temperature material to a thickness substantially impermeable to an implantation with a second impurity type material;
   removing said first and second layers of high temperature material in a second FET region;
   subjecting said substrate to an implantation using said second impurity type materials; and
   removing residual first and second layers of high temperature material from said substrate with an etchant material, said etchant material preferentially etching said high temperature material at a significantly greater rate than said dielectric material.

2. The process recited in claim 1, wherein said gate electrodes are composed of doped polycrystalline silicon, and said step of forming a layer of dielectric material to protect said gate electrodes is comprised of the following sequence:
   forming a layer of silicon dioxide on top of said gate electrodes; and
   growing silicon dioxide on the top and side walls of said gate electrodes until the silicon dioxide layer on the top is of a thickness substantially impermeable to said implantations of first or second impurity type materials.

3. The process recited in claim 2, wherein said high temperature material is silicon nitride.

4. The process recited in claim 3 wherein said etchant material contains phosphoric acid and said implantations are high current, high energy implants with boron and arsenic ions.

5. The processes recited in claims 1, 2, 3 or 4, wherein said etchant material has a preferential etch ratio exceeding 20:1.

* * * * *